(12) United States Patent
Zaghlol

(10) Patent No.: US 7,497,013 B2
(45) Date of Patent: Mar. 3, 2009

(54) METHOD AND APPARATUS FOR COUPLING FINS IN A HIGH-FIN DENSITY HEATSINK TO DUAL HEAT-DISSIPATING BASE PLATES

(75) Inventor: Ahmed Zaghlol, Cambridge (CA)

(73) Assignee: R-Theta Thermal Solutions Inc., Mississauga, ON (CA)

( * ) Notice: Subject to any disclaimer, the term of this patent is extended or adjusted under 35 U.S.C. 154(b) by 683 days.

(21) Appl. No.: 11/106,440

(22) Filed: Apr. 15, 2005

(65) Prior Publication Data
US 2006/0230616 A1    Oct. 19, 2006

(51) Int. Cl.
*B21D 53/02* (2006.01)
(52) U.S. Cl. .................. 29/890.03; 165/80.3; 165/185
(58) Field of Classification Search . 29/890.03–890.06; 165/80.3, 185
See application file for complete search history.

(56) References Cited

U.S. PATENT DOCUMENTS

| | | | | |
|---|---|---|---|---|
| 5,014,776 A | * | 5/1991 | Hess | 165/185 |
| 5,406,698 A | * | 4/1995 | Lipinski | 29/727 |
| 5,542,176 A | * | 8/1996 | Serizawa et al. | 29/890.03 |
| 5,638,715 A | | 6/1997 | Lipinski | |
| 5,771,966 A | | 6/1998 | Jacoby | |
| 5,937,517 A | | 8/1999 | Smith et al. | |
| 6,263,956 B1 | | 7/2001 | Tang et al. | |
| 6,758,262 B2 | * | 7/2004 | Kawabata et al. | 165/80.3 |
| 2002/0007936 A1 | | 1/2002 | Woerner et al. | |
| 2002/0043359 A1 | | 4/2002 | Mizutani | |

FOREIGN PATENT DOCUMENTS

| | | |
|---|---|---|
| DE | 29601776 U1 | 6/1996 |
| DE | 19900970 A1 | 7/2000 |
| DE | 202004009712 U1 | 11/2004 |
| WO | 0241677 A | 5/2002 |

* cited by examiner

*Primary Examiner*—Rick K Chang
(74) *Attorney, Agent, or Firm*—Stephen J. Perry

(57) ABSTRACT

A dual base plate heatsink for use in dissipating heat for electronic devices with thermal contact between fins and the base plates and manufactured without welding. Separately extruded fins are connected to both base plates by placing the fins side by side in channels in both base plates. In order to couple the base plates and the fins, the base plates are maintained at a constant relative distance and a swaging tool is passed adjacent the fins and between the base plates in a direction parallel to the surface of the base plates. The swaging tool applies pressure to the base plates to thereby swage the base plates against the ends of the fins.

8 Claims, 7 Drawing Sheets

METHOD AND APPARATUS FOR COUPLING FINS IN A HIGH-FIN DENSITY HEATSINK TO DUAL HEAT-DISSIPATING BASE PLATES

FIELD OF THE INVENTION

This invention relates in general to the manufacture of Heatsinks, and more specifically to a method for coupling fins in a high fin-density heatsink to dual heat-dissipating base plates.

BACKGROUND OF THE INVENTION

Heatsinks are known in the art for receiving and then dissipating heat generated by electronic circuits in modern devices. Such well known heatsinks typically comprise one base unit to which the heat generating electronic devices are mounted, and a plurality of fins projecting from the base unit for dissipating the generated heat. It is a challenge to maximize the surface area of the fins in order to provide optimum heat transfer from the heat sink to the surrounding atmosphere while ensuring good thermal contact between the base unit and the fins.

Heatsinks fabricated by metal extrusion have been proposed, wherein the fins and the base units are of integral construction and thereby have the optimum thermal contact. However, as discussed in the disclosure of U.S. Pat. No. 5,406,698 (Lipinksi), it has been shown that there are limits to the size and shape of fins that may be made by way of extrusion manufacturing. There has thus been proposed various methods of manufacturing whereby the fins are extruded separately from the base unit, and subsequently coupled using various methods.

U.S. Pat. No. 5,771,966 (Jacoby) discloses a folded heat conducting member or fin with at least one annealed metal insert having a predetermined thickness corresponding to a distance between the first and second heat conductive portions of the fin and a predetermined thickness corresponding to a depth of the groove in the base plate so that the annealed metal insert conforms to the shape of the groove when deformed to secure the base portion engaging region of the folded heat conducting member into the groove. The Jacoby patent proposes an impacting die to perform a deforming or swaging function to deform the fin while in the groove so that it is not removable.

U.S. Pat. No. 6,263,956 to Tang et al. sets forth a heat dissipating structure and method of manufacture where each slot in the base has a width slightly less than a thickness of an inserting portion of the associated heat dissipating fin, so that it will allow the heat dissipating fin to tightly insert therein. A fixing frame is then moulded into place for securing the fins. The fixing frame is formed by introducing a melt fixing material inside of fixing recesses and thereafter cooling. As the material forms a solid, it forms the fixing frame that secures the heat dissipating fins onto the base.

Published U.S. Patent Application No. 2002/0007936 (Woerner et al.) discloses one or more folded-fin assemblies "tacked" to the base at selected points by laser welds. In a subsequent operation, the full surface of the lower web portions of the folded-fin assemblies are bonded to the base, typically by brazing. According to the Woerner disclosure, some suitable mechanical means is used to urge the lower web portions against the base prior to the laser welding, to optimize the contact between the lower web portions and the base when the subsequent brazing takes place. Also, a finger tool is used to maintain the desired spacing between adjacent fins prior to laser welding, to optimize that spacing and avoid the possibility of adjacent fins being positioned unevenly or in contact with each other. The heatsink assembly is said to be unloaded from the laser welding apparatus and taken for brazing, soldering or other suitable bonding to the base. As an example, the heatsink assembly may receive a spray application of flux which is then oven-dried and may be passed to a brazing furnace for heating to a temperature range of 1100-1120° F. to carry out the brazing.

Published U.S. Patent Application No. 2002/0043359 (Mizutani) sets forth a method of manufacturing a heatsink wherein fins are pressed by means of a mould so that protrusions provided on the back side of the metal plate are pressed into "bottom-expanded recesses" to fix the heat dissipation fins and the base plate together. Mizutani teaches an impact-die mold for pressing protrusions in the base plate against the fins to keep them secure to the base plate.

Mentioned above, U.S. Pat. No. 5,406,698 (Lipinksi), proposes a heat sink manufactured by providing a baseplate with several parallel grooves in its surface. Individual fins are manufactured having a dovetail or bell-bottom at their end, the ends then being inserted into respective grooves. The base plate is subsequently deformed in the areas between the parallel channels by rolling a plurality of coaxial rollers through the areas in order to crimp or swage the fins into the grooves. The Lipinski apparatus is an excellent design that requires little pressure to be transmitted though the fins themselves, so that their tendency to undesirably buckle under downward pressure is minimised. However, in the process of deforming the base unit in the areas between the parallel channels, the entire base unit tends to warp. To this end, U.S. Pat. No. 5,638,715 (Lipinski) sets forth an apparatus for subsequently reversing the warp effect.

With increased consumer demand for more complex electronic systems, the need has arisen for the more efficient use of space when manufacturing these systems. To help meet this demand, dual base plate heatsinks have been proposed that are mounted to more than one electronic device but that dissipate heat through a common set of fins. With these proposals have come a corresponding set of challenges for manufacturing the heatsinks to specifications that promote excellent heat transfer and good contact between the base plates and the fins. For example, the Lipinksi apparatus would not be sufficient for the manufacture of dual baseplate heatsinks because the proposed roller assembly would not be permitted to pass through the spaces between the fins once the second base plate was in place.

SUMMARY OF THE INVENTION

According to the present invention, a high fin-density dual base plate heatsink is manufactured by placing fins side by side in channels formed in each of two opposing base plates. In order to couple the base plates and the fins, the relative distance between the base plates is held constant and a swaging tool is passed both adjacent the fins and between the base plates in a direction parallel to the base plates. The pressure exerted by the swaging tool against the base plates adjacent the fins as the base plates are held at a constant relative distance swages the base plate adjacent each fin against the fin. Pressure is thus applied to the end of each fin inserted in each channel thereby securing the fin to the base plate.

BRIEF DESCRIPTION OF THE DRAWINGS

A detailed description of the preferred embodiment is set forth in detail below, with reference to the following drawings, in which.

DETAILED DESCRIPTION OF THE PREFERRED EMBODIMENT

According to the present invention in its most general aspect, a dual base plate heatsink is manufactured by providing two opposing base plates, each with an inward facing surface and a number of elongate landing areas separated by elongate channels. Fins are placed into the channels of the opposing base plates and, while the base plates are being maintained at a constant relative distance, a swaging tool is passed in a direction parallel to the surface adjacent the fins and between the base plates. As the tool is passed it increasingly applies pressure to the landing areas of the base plate adjacent the fins to swage the base plate material against the fins. The swaging of the base plate causes pressure to be applied to the fins to force them to remain coupled to the base plates.

Figure 1:
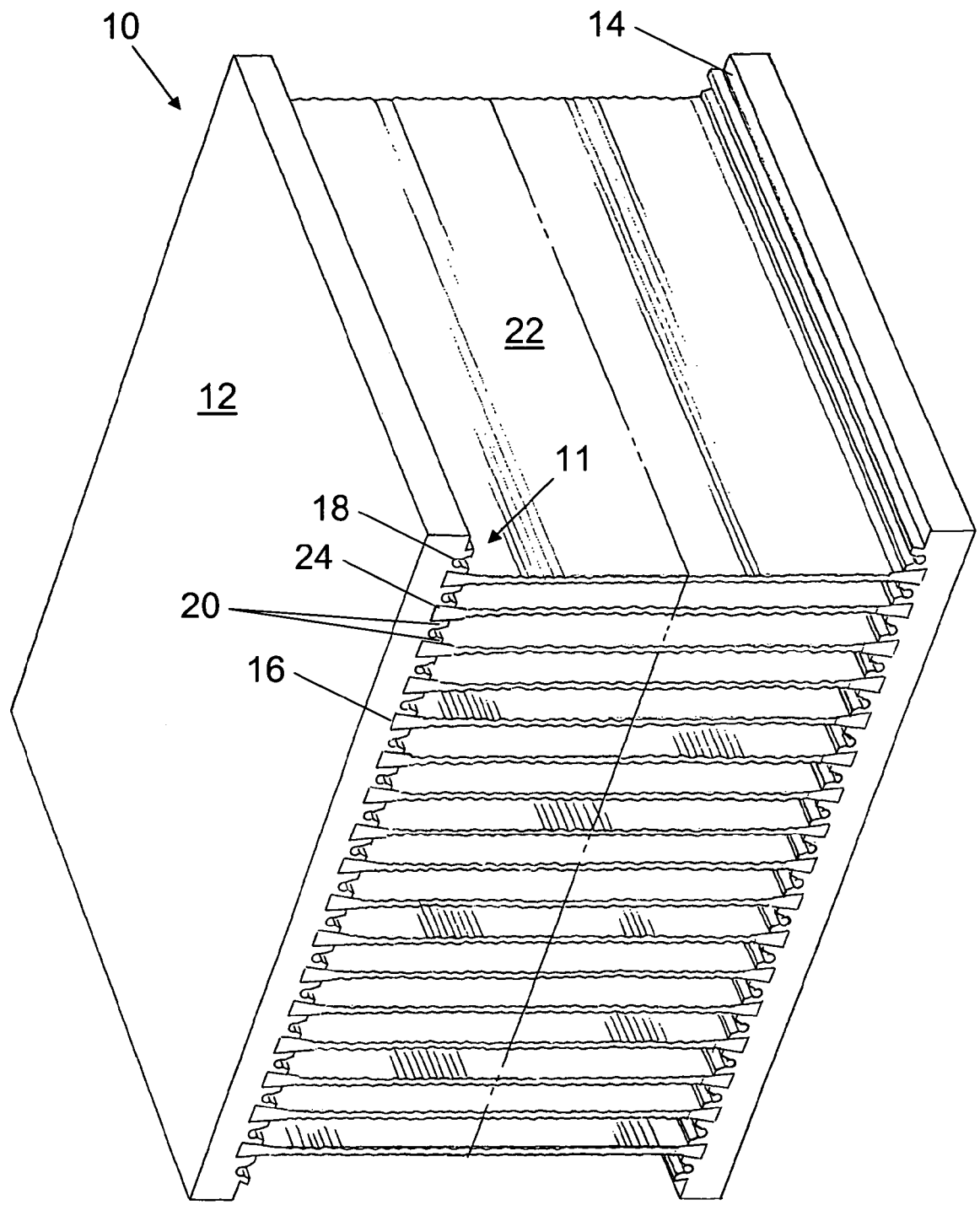
FIG. 1 is a perspective view of a completed heatsink made according to the preferred method of the present invention.

With reference to FIG. 1, there is shown a dual base plate heatsink 10 made according to the preferred method of the present invention. The heatsink 10 comprises two opposing base plates 12, each base plate having an inward-facing surface 14. Landing areas 11 of base plate 12 are separated by channels 16 and comprise an elongate jaw pair 18, having jaws 20. Fins 22 have flared ends 24 that fit in between adjacent jaw pairs 18 of respective base plates 12. The channels 16 in the surface 14 between the jaw pairs 18 receive the flared ends 24 of the fins 22. As can be seen from the diagram, the fins 22 are held in place by jaws 20 which have been swaged towards the fins 22 to apply pressure to the flared ends 24 of the fins 22. The advantage of the flared ends 24 of the fins 22 is that when the jaws 20 have been swaged, a more uniform and secure fit is achieved for increased heat transfer.

Figure 2:
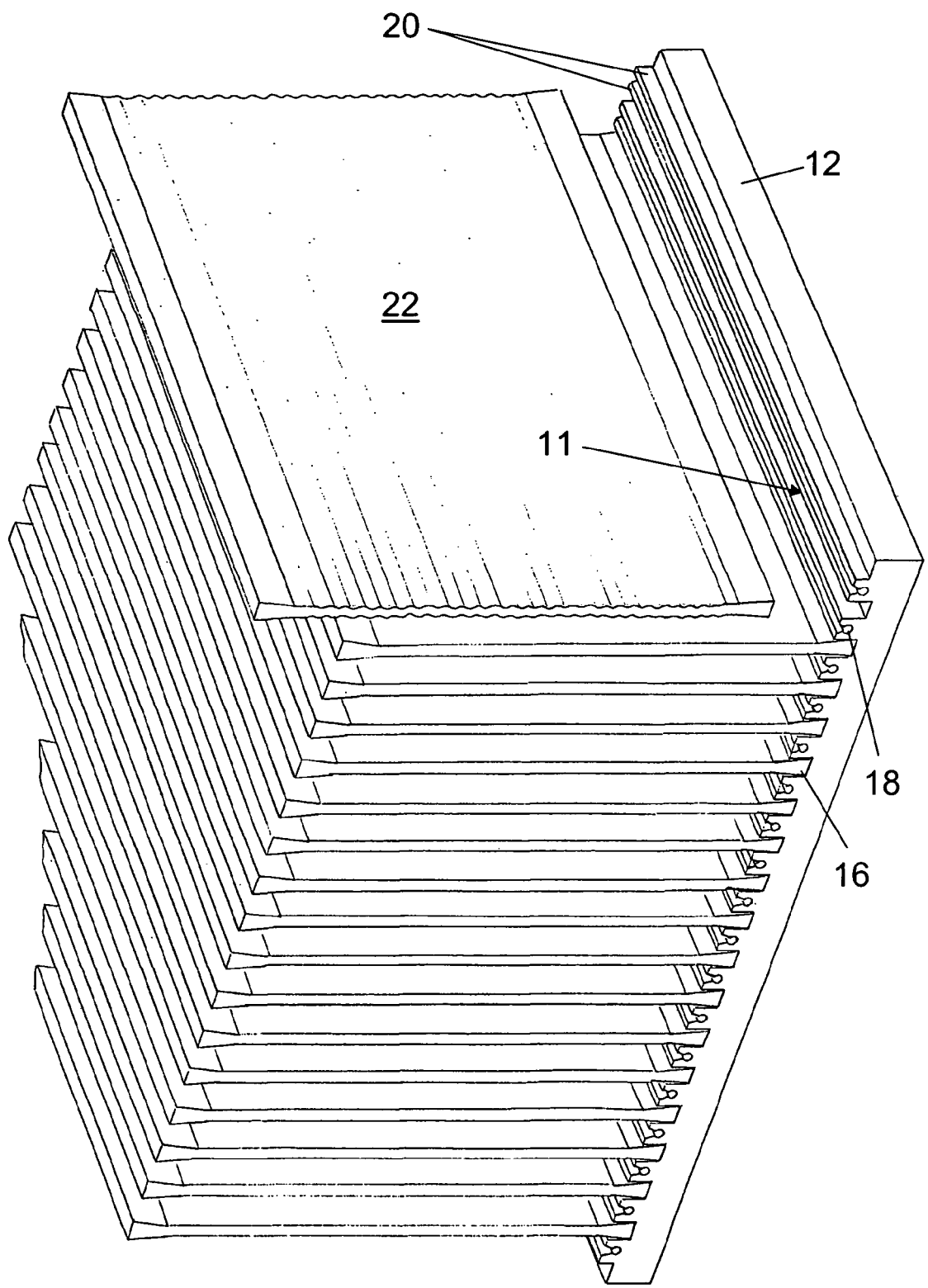
FIG. 2 is a perspective view of fins being mounted into a single base plate, prior to the swaging operation according to the preferred method of the present invention.

With reference to FIG. 2, there is shown a heatsink 10 being made according to the method of the present invention, wherein a fin 22 is being lowered into one of the channels 16 between landing areas 11 of a base plate 12. Once all of the fins 22 have been placed into corresponding channels 16 between said jaw pairs 18, the second base plate 12 is fit onto the flared ends 24 of the fins 22.

Figure 3:
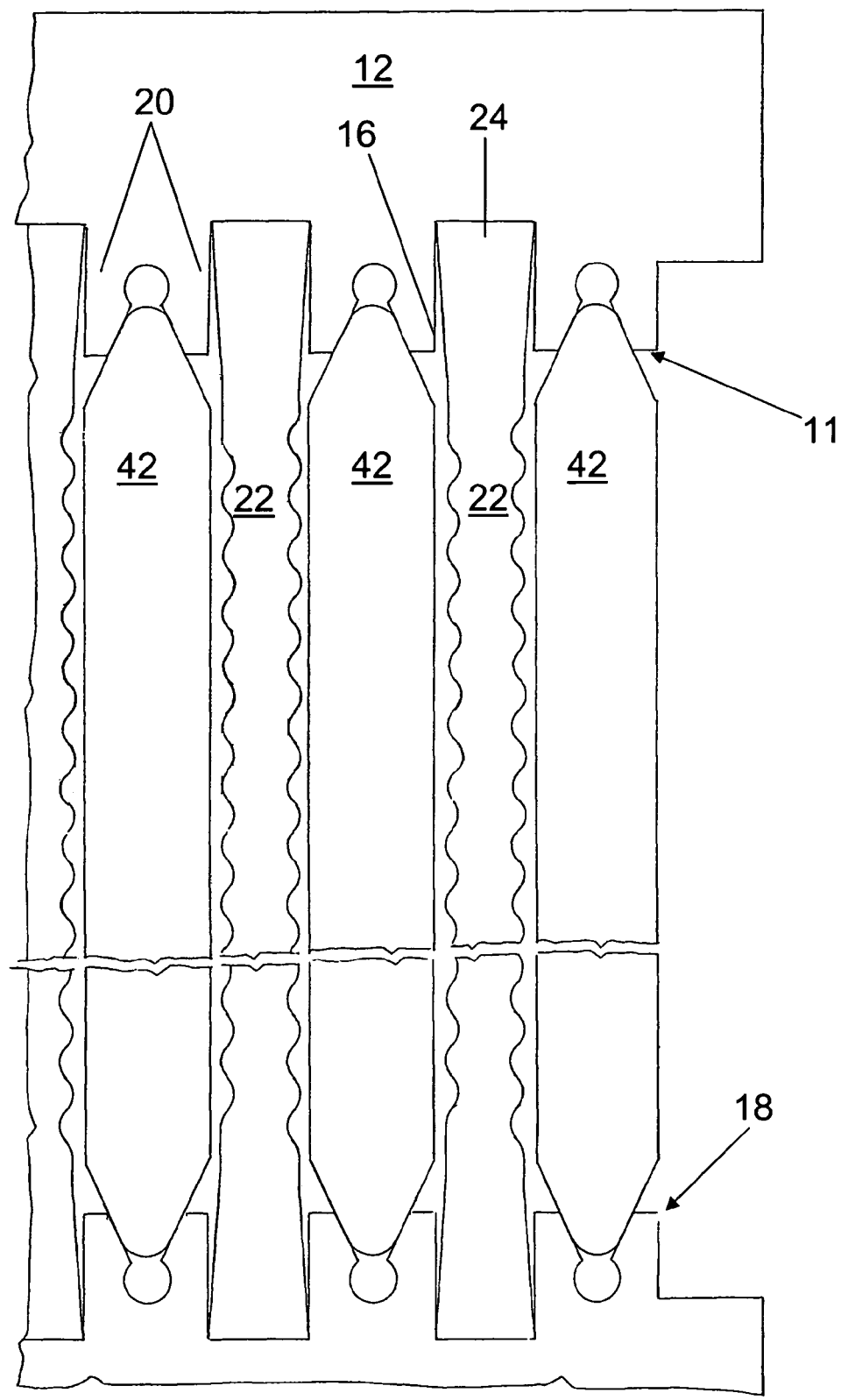
FIG. 3 is a partial front view of a heatsink with a swaging tool being passed adjacent its fins and against the base plates according to the preferred method of the present invention.

With reference to FIG. 3, there is shown a front view of the heatsink 10 being made according to the principles of the present invention. In this diagram, the fins 22 have been placed into corresponding channels 16 between landing areas 11 of the base plates 12, and a swaging tool 40 (fully illustrated in FIG. 7) has been placed through the fins 22 and into the space between jaws 20 in each jaw pair 18. This diagram shows clearly the flared ends 24 of the fins 22 in between jaw pairs 18.

Furthermore, the shape of each jaw 20 is shown clearly. The jaws 20 progressively widen in cross section from the end distal to the surface 14 of the base plate 12 towards the surface 14, and then narrow again. The base plates are maintained at a constant relative distance, as discussed in greater detail below with reference to FIG. 7. The widening of the jaws 20 co-operates with the wedge shape of the swaging tool 40 to progressively force the jaws 20 apart when the tines 42 of the swaging tool 40 are being passed between the respective jaws 20 in the jaw pairs 18. Furthermore, the narrowing ensures that swaging the jaws 20 causes minimal warping of the base plates 12 because of a lower bending moment.

Figure 4:
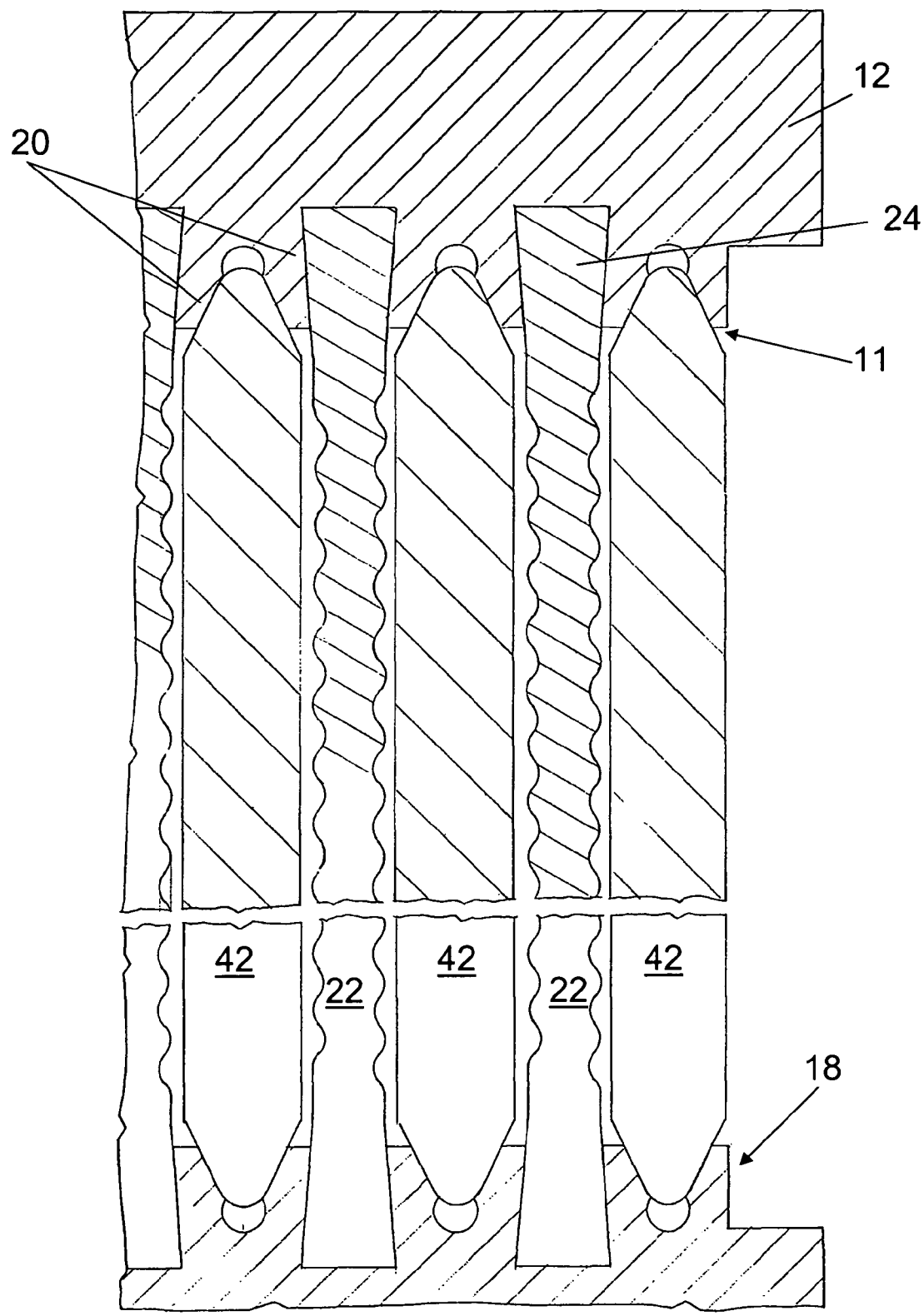
FIG. 4 is a partial front view of a heatsink with the swaging tool having passed further adjacent the fins thereby having caused swaging of the base plates against each of the fins according to the preferred method of the present invention.
Figure 5:
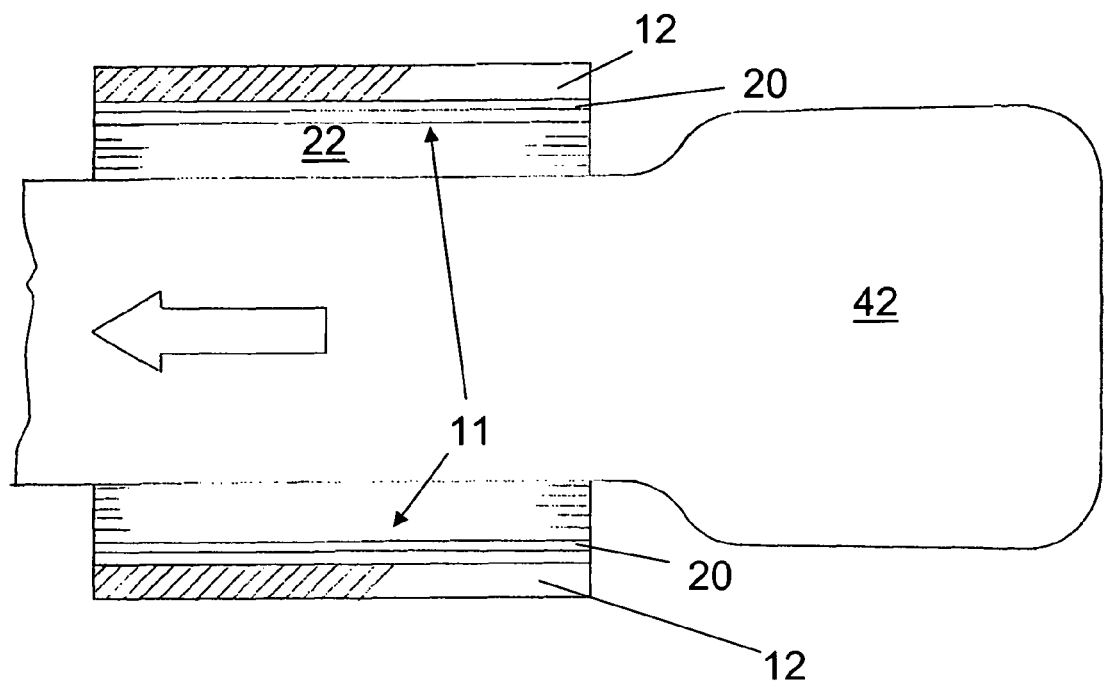
FIG. 5 is a cutaway partial side view of a shorter end of a tine of the swaging tool being passed adjacent a fin prior to swaging the base plates, according to the preferred method of the present invention.
Figure 6:
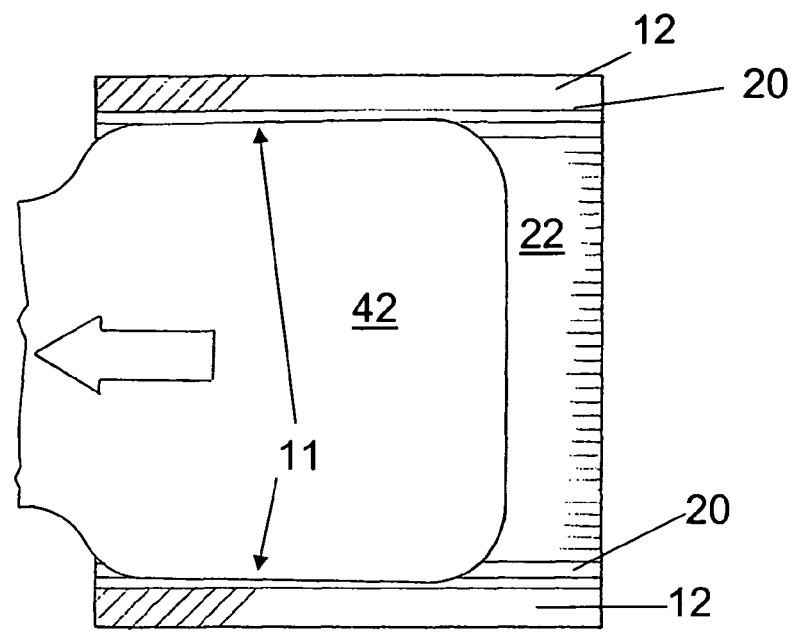
FIG. 6 is a cutaway partial side view of a taller end of a tine of the swaging tool being passed adjacent a fin and against the base plates to swage the base plates against the fin, according to the preferred method of the present invention.
Figure 7:
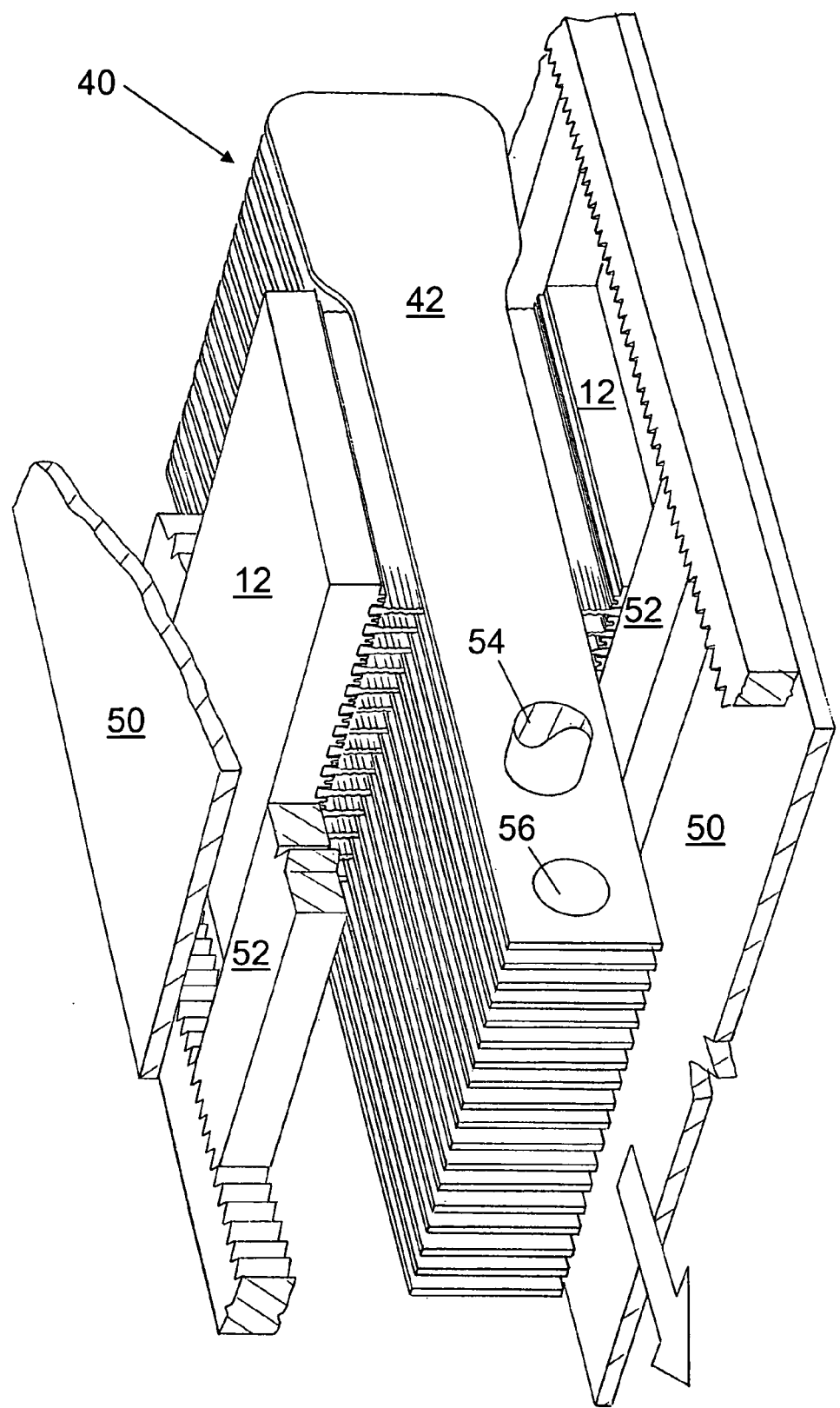
FIG. 7 is a cutaway perspective view of the apparatus for manufacturing high-density heatsinks in accordance with the preferred method of the present invention.

In FIG. 4, the tines 42 of the swaging tool 40 are caused to slide in a direction parallel to the surfaces 14 of base plates 12 and between the jaws 20. Because the tines 42 of the swaging tool 40, shown more clearly in FIGS. 5-7, are increased in height towards its second end, they push against the jaws 20 of the landing area 11 to swage them apart and against the flared ends 24 of the fins 22. Because the base plates 12 are being maintained at a constant relative distance, the jaws 20 are forced apart due to the increase in pressure from the tines 42 as the swaging tool 40 is pulled through the fins 22. The flared ends 24 of the fins 22 are pressed into channels 16 of each base plate 12 and, because the jaws 20 of base plates 12 have been deformed, are retained therein.

FIGS. 5 and 6 show a side cutaway view of a single tine 42 of the swaging tool 40 being passed between the base plates 12. As can be seen, the widened second end of the tine 42 pushes against both jaw pairs 18 of the landing areas 11 on both base plates 12 to progressively force open the jaws 20 and push them against the flared ends 24 of the fin 22.

FIG. 7 shows an exemplary view of the apparatus used to form the heatsink 10 according to the present invention. The uncoupled heatsink 10 is placed in a retaining structure having expansion-preventing walls 50 to maintain the base plates 12 at a constant relative distance. The swaging tool 40 is shown having multiple tines 42 that are each pulled past the fins 22 of the heatsink 10 to force open the jaws 20 in each jaw pair 18 of the landing area 11 so that the jaws 20 push against the flared ends 24 of the fins 22 to hold them in place in the channel 16 of the base plate 12.

In the embodiment of FIG. 7, the tines 42 are pulled by a shaft 54 passing through a hole in each tine. The shaft is, in turn, pulled by a hydraulic motor or other motive apparatus. An alternate shaft attachment hole 56 is shown in each of the tines 42.

Also shown in FIG. 7 are slide-preventing walls 52 which act to prevent the fins 22 from sliding relative to the base plates 12 when the tines 42 of said swaging tool 40 are pulled from left to right. The slide-preventing walls avoid the requirement set forth in U.S. Pat. No. 5,406,698 to, after coupling of the fins 22 to the base plates 12, remove the parts of the fins 22 that have slid relative to the base plates 12 during application of swaging pressure.

A person understanding the present invention may conceive of alternatives and variations thereof. For instance, rather than employing slide-preventing walls for preventing the fins from sliding relative to the base plates, a pressure force can be applied to both base plates to increase the friction force between the fins and the base plates thereby reducing or prevent any relative movement. Furthermore, whereas the flared fin ends of the preferred embodiment provide a more uniform fit for better heat transfer with the jaw pairs when swaged, uniform thickness fins can also be used.

An alternative to the smooth-sided fin shape, whether flared or not, is to provide serrations on the end of the fin to improve bonding when the base plate material is deformed against the fin.

All such embodiments and variations are believed to be within the purpose, sphere and scope of the invention as defined by the claims appended hereto.

What is claimed is:

1. A method of manufacturing a dual base plate heatsink, said method comprising:
   providing a plurality of heat-conducting fins, each of said fins with opposing ends;
   providing two opposing heat conducting base plates, each of said base plates comprising an inward facing surface with a plurality of elongate landing areas thereon, each of said landing areas separated by an elongate channel;
   inserting each of said ends of said fins into respective ones of said channels of each of said opposing base plates;
   placing a first portion of a swaging tool between said opposing base plates, said swaging tool comprising a series of elongate tines, said series of tines dimensioned to be disposed adjacent each of said fins, each of said tines increasing in height from said first portion to a second portion;
   while maintaining relative distance between said base plates, sliding said swaging tool adjacent said fins in a direction parallel to each said surface so that said second portion of each said tine increasingly applies pressure to a corresponding landing area, to increasingly swage each of said landing areas against each of said adjacent fins;
   whereby swaging of each said landing area secures each said fin to each of said base plates.

2. The method of claim 1, wherein each said landing area comprises elongate jaw pairs, each jaw in said jaw pairs having a uniform cross section that first progressively widens and then narrows from its distal end to said surface, said widening corresponding to a decrease in distance between corresponding portions of the jaws in each said jaw pair, and wherein said sliding step comprises increasingly applying wedging pressure to said jaws to swage said jaws against said fins.

3. The method of claim 1, further comprising preventing said fins from moving relative to said base plates during said sliding step.

4. The method of claim 2, further comprising preventing said fins from moving relative to said base plates during said sliding step.

5. The method of claim 3, wherein said preventing is effected by applying pressure onto said base plates to increase friction between said fins and said base plates.

6. The method of claim 4, wherein said preventing is effected by applying pressure onto said base plates to increase friction between said fins and said base plates.

7. The method of claim 3, wherein said preventing is effected by abutting a slide-preventing wall against an end of each said base plate.

8. The method of claim 4, wherein said preventing is effected by abutting a slide-preventing wall against an end of each said base plate.

* * * * *